United States Patent
Peng et al.

(10) Patent No.: US 9,547,233 B2
(45) Date of Patent: Jan. 17, 2017

(54) FILM-GROWTH MODEL USING LEVEL SETS

(71) Applicant: Dino Technology Acquisition LLC, Milpitas, CA (US)

(72) Inventors: Daniel Ping Peng, Fremont, CA (US); Masaki Satake, San Jose, CA (US); Changqing Hu, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 747 days.

(21) Appl. No.: 13/830,327

(22) Filed: Mar. 14, 2013

(65) Prior Publication Data

US 2014/0278231 A1    Sep. 18, 2014

(51) Int. Cl.
*G03F 1/24*    (2012.01)
*G03F 1/72*    (2012.01)
*G03F 7/20*    (2006.01)

(52) U.S. Cl.
CPC . *G03F 1/72* (2013.01); *G03F 1/24* (2013.01); *G03F 7/705* (2013.01)

(58) Field of Classification Search
CPC .................................................. H04R 19/005
USPC 702/14, 18, 127, 147, 167; 367/36; 381/166
See application file for complete search history.

(56) References Cited

U.S. PATENT DOCUMENTS

| | | | | |
|---|---|---|---|---|
| 5,671,136 A | * | 9/1997 | Willhoit, Jr. | G01V 1/30 702/18 |
| 6,081,482 A | * | 6/2000 | Bevc | G01V 1/28 367/36 |
| 6,893,780 B1 | | 5/2005 | Galan et al. | |
| 7,805,700 B2 | | 9/2010 | Peng | |
| 2005/0219679 A1 | | 10/2005 | Ishikawa | |
| 2007/0230721 A1 | * | 10/2007 | White | H04R 19/005 381/166 |
| 2009/0013304 A1 | | 1/2009 | Peng | |

OTHER PUBLICATIONS

Chen, S., et al., "A Level Set Method for Thin Film Epitaxial Growth" Journal of Computational Physics 167, (2001) pp. 475-500.

(Continued)

*Primary Examiner* — Alexander Satanovsky
*Assistant Examiner* — Felix Suarez
(74) *Attorney, Agent, or Firm* — Kwan & Olynick LLP

(57) ABSTRACT

A technique for determining a set of surface profiles in a multilayer stack during a fabrication process may be determined using a model of this fabrication process, a geometry of the multilayer stack (such as a pre-defined geometry of the multilayer stack) and a surface profile in the multilayer stack (such as a measured surface profile of the top surface or a bottom surface of the multilayer stack). For example, the model of the fabrication process may be based on a generalized Eikonal equation. In conjunction with deposition rates and/or physical properties of the layers in the multilayer stack, deposition or growth of the multilayer stack may be simulated. Based on the determined set of surface profiles, an acceptance condition of the multilayer stack (such as a multilayer stack in a photo-mask for use in extreme ultra-violet photolithography) may be determined and/or a remedial action may be recommended.

20 Claims, 7 Drawing Sheets

(56) References Cited

OTHER PUBLICATIONS

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.
Sethian, J.A. and Adalsteinsson, D., "An overview of level set methods for etching, deposition, and lithography development", IEEE Trans. on Semiconductor Manufacturing, vol. 10, No. 1, pp. 1-30, Jan. 8, 1996.
Stearns, D.G., et al., *"Localized Defects in Multilayer Coatings"*, www.sciencedirect.com, Thin Solid Firms 446 (2004) pp. 37-49.
"International Application Ser. No. PCT/US014,023746, Search Report mailed Jul. 8, 2014", 2 pgs.

\* cited by examiner

FILM-GROWTH MODEL USING LEVEL SETS

BACKGROUND OF THE INVENTION

Field of the Invention

The present invention relates to techniques for modeling film growth in a multilayer stack.

Related Art

Photolithography is a widely used technology for producing integrated circuits. In this technique, a light source illuminates a photo-mask. The resulting spatially varying light pattern is projected onto a photoresist layer on a semiconductor wafer by an optical system (which is referred to as an 'exposure tool'). By developing the 3-dimensional (3D) pattern produced in this photoresist layer (which is sometimes referred to as a 'target pattern'), a layer in the integrated circuit is created. Furthermore, because there are often multiple layers in a typical integrated circuit, these operations may be repeated using several photo-masks to produce a product wafer.

In order to appropriately scale to smaller critical dimensions in integrated circuits (and, thus, to reduce diffraction and proximity effects that occur when light is propagated through the optics of the exposure tool and is converted into the 3D pattern in the photoresist), commensurately smaller wavelengths of light may be provided by the light source. However, it is difficult to design and manufacture transmission photo-masks at small wavelengths, such as in the extreme ultra-violet.

Recently, reflective photo-masks have been investigated for use with wavelengths in the extreme ultra-violet. In a reflective photo-mask, a multilayer stack is used to reflect the light from the light source. For example, multiple alternating layers of silicon and molybdenum may be deposited on silicon or a glass substrate having an ultra-low thermal expansion coefficient (such as quartz). Then, the mask pattern may be defined in an absorption layer (such as tantalum nitride) that is deposited on top of the multilayer stack.

In practical reflecting photo-masks, up to 80 alternating layers are used. Furthermore, these layers may have thicknesses as small as 2-4 nm. However, this structure can be difficult to manufacture. For example, during the manufacturing process defects can occur throughout the multilayer stack. It can be difficult to detect the presence of a defect in the multilayer stack without performing destructive analysis. In addition, even if a defect is detected (or when a type of defect is probable in a given manufacturing process), it is often difficult (or impossible) to predict the consequences of the defect in the photolithographic process (e.g., will the defect result in an unacceptable change in the 3D pattern) or to determine how to modify a reflective photo-mask to reduce or eliminate the effect of a defect on the photolithographic process. As a consequence, the inspection and qualification criteria for reflective photo-masks are often needlessly conservative, which results in rejection of reflective photo-masks that could be successfully used in the photolithographic process (i.e., the reflective photo-mask yield may be needlessly reduced), thereby significantly increasing the cost of reflective photo-masks. In addition, it is often difficult to appropriately modify the photo-mask to reduce or eliminate the effect of the defect on the photolithographic process, which also adversely impacts the reflective photo-mask yield, and this also increases the cost of reflective photo-masks.

Hence, what is needed is a reflective photo-mask inspection and qualification technique and a reflective photo-mask repair technique that overcomes the problems listed above.

SUMMARY OF THE INVENTION

The present disclosure relates to a computer system for determining a set of surface profiles. During operation, the computer system receives a surface profile of a surface in a multilayer stack. Then, the computer system calculates a second surface profile of a second surface in the multilayer stack based on a generalized Eikonal equation, a geometry of the multilayer stack and the surface profile. Note that the second surface is associated with a different layer in the multilayer stack than the surface, and the second surface is adjacent to the surface in the multilayer stack. Next, the computer system repeats, one or more times, the calculation operation for additional surfaces in the multilayer stack based on a generalized Eikonal equation, a geometry of the multilayer stack, the surface profile, and surface profiles determined in preceding instances of the calculation operation, thereby determining the set of surface profiles. Moreover, note that a given additional surface is associated with a different layer in the multilayer stack than the surface profile and the surface profiles determined in preceding instances of the calculation operation, and the given additional surface is adjacent to another surface in the multilayer stack that is associated with another layer in an immediately preceding instance of the calculation operation.

In some embodiments, the surface may be a top surface of the multilayer stack. In these embodiments, the calculation operation may involve an inverse calculation in which the given additional surface is underneath the other surface. Alternatively, the surface may be a top surface of a substrate underneath the multilayer stack. In these embodiments, the calculation operation may involve a forward calculation in which the given additional surface is on top of the other surface.

Additionally, prior to calculating the second surface profile, the computer system may receive an optical characteristic of the multilayer stack, and the calculation operation may be based on the received optical characteristic. Note that the optical characteristic may include information corresponding to a complex index of refraction of the multilayer stack at one wavelength. In some embodiments, the calculation operation is based on: the complex indices of refraction of materials in the multilayer stack proximate to at least the one wavelength; physical properties of materials in the multilayer stack; and/or deposition rates of one or more layers in the multilayer stack. Moreover, the calculation operation may involve simulating deposition of one or more layers in the multilayer stack.

Furthermore, the surface profile may include a shape that, at a given location on the surface, is associated with more than one value of a vertical displacement. Additionally, the surface profile may include a surface roughness.

In some embodiments, after repeating the calculation operation, the computer system determines an acceptance condition of the multilayer stack based on one or more of the surface profiles in the determined set of surface profiles. Additionally, after determining the acceptance condition, the computer system may provide a remedial action based on the determined acceptance condition.

Note that, at least during the calculation operation, a given surface profile may be represented using a level-set function. Moreover, the multilayer stack may be associated with a lithographic process. For example, the multilayer stack may be associated with an extreme ultra-violet photo-mask.

Another embodiment provides a method including at least some of the above-described operations.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION OF THE INVENTION

Figure 1:
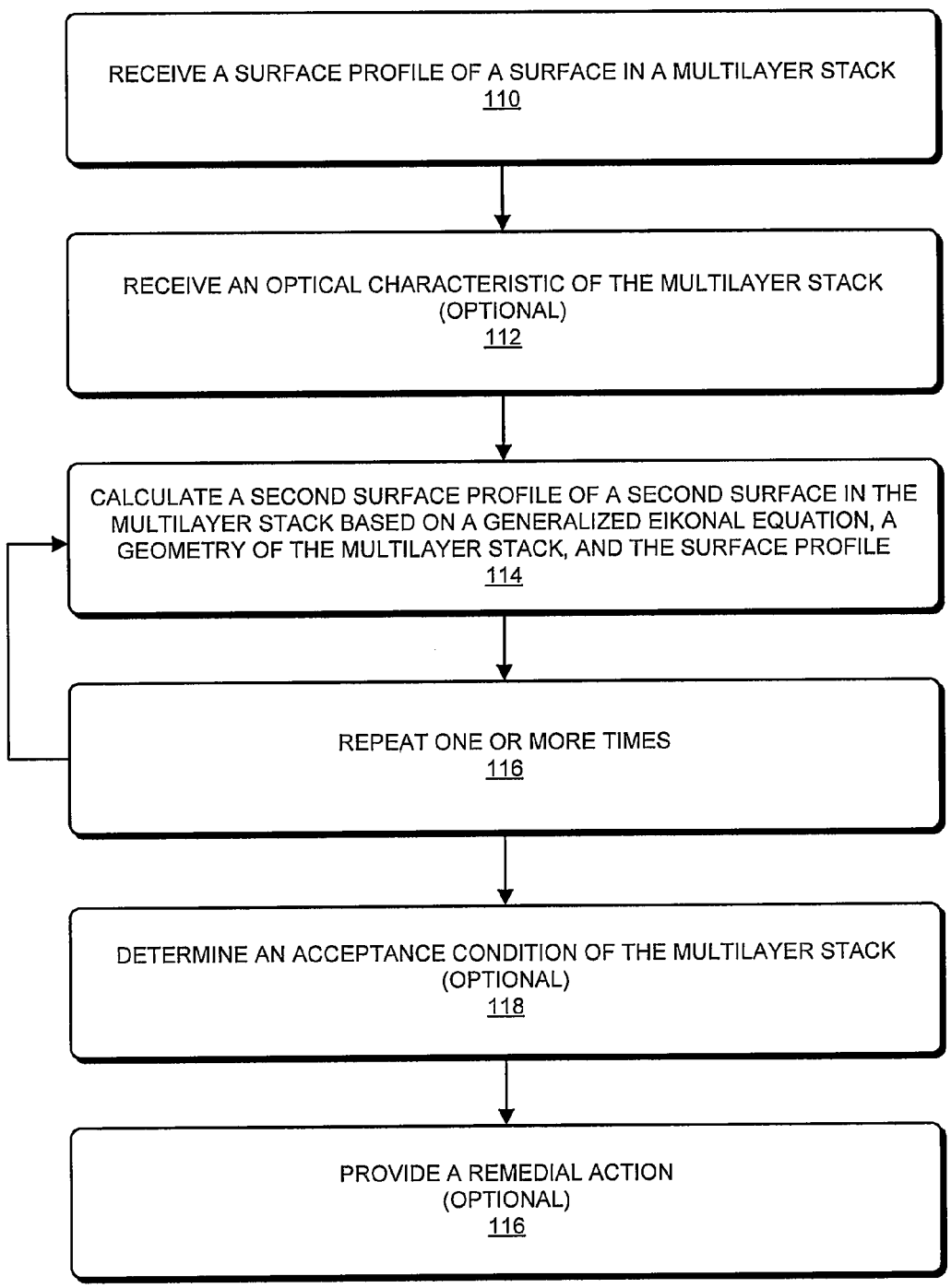
FIG. 1 is a flow chart illustrating a method for determining a set of surface profiles in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These systems and processes may be used to model at least a portion of one or more fabrication processes. These processes may include fabrication of photo-masks that print patterns onto wafers and/or semiconductor dies. More generally, the one or more fabrication processes may include deposition or growth of multiple layers on a substrate, which may occur when fabricating a photo-mask or a semiconductor die.

In particular, a set of surface profiles in a multilayer stack during a fabrication process may be determined using a model of this fabrication process, a geometry of the multilayer stack (such as a pre-defined geometry of the multilayer stack) and a surface profile in the multilayer stack (such as a measured surface profile of the top surface or a bottom surface of the multilayer stack). For example, the model of the fabrication process may be based on a generalized Eikonal equation. In conjunction with deposition rates and/or physical properties of the layers in the multilayer stack (such as an optical characteristic at a wavelength), deposition or growth of the multilayer stack may be simulated. Based on the determined set of surface profiles, an acceptance condition of the multilayer stack (such as a multilayer stack in a photo-mask for use in extreme ultra-violet photolithography) may be determined and/or a remedial action may be recommended. In this way, the yield and/or the performance of the multilayer stack may be increased.

In the discussion that follows, photo-masks should be understood to include: reflective photo-masks for use in extreme ultra-violet photolithography, chromium-on-glass photo-masks, alternating phase-shifting photo-masks, attenuating phase-shifting photo-masks, and/or multiple-exposure photo-masks (i.e., where patterns printed using two or more photo-masks are combined to produce a desired pattern). In addition, in the discussion that follows note that a mask pattern or a target pattern may include a bitmap or grayscale file that includes a set of values corresponding to pixels in the mask pattern or the target pattern. Furthermore, the quantization (i.e., the number of bits) in these files may be varied, as needed, during the calculations that are described. Alternative formats having the same or similar information content, including a vector-based format such as a Graphic Design System II (GDSII) and/or an OASIS format, may be used in some embodiments of the mask pattern or the target pattern. In some embodiments, the mask pattern or the target pattern include real and imaginary components (or equivalently, magnitude and phase information).

We now describe embodiments of a computer system, a method, and software for determining a set of surface profiles. FIG. 1 presents a flow chart illustrating a method 100 for determining a set of surface profiles, which may be performed by a computer system (such as computer system 700 in FIG. 7). During operation, the computer system receives a surface profile of a surface in a multilayer stack (operation 110). For example, the surface profile may be determined using atomic force microscopy. Then, the computer system calculates a second surface profile of a second surface in the multilayer stack based on a generalized Eikonal equation, a geometry of the multilayer stack and the surface profile (operation 114). Note that the second surface profile is associated with a different layer in the multilayer stack than the surface, and the second surface is adjacent to the surface in the multilayer stack. Next, the computer system repeats (operation 116), one or more times, the calculation operation for additional surfaces in the multilayer stack based on a generalized Eikonal equation, a geometry of the multilayer stack, the surface profile, and surface profiles determined in preceding instances of the calculation operation, thereby determining the set of surface profiles. Moreover, note that a given additional surface is associated with a different layer in the multilayer stack than the surface profile and the surface profiles determined in preceding instances of the calculation operation, and the given additional surface is adjacent to another surface in the multilayer stack that is associated with another layer in an immediately preceding instance of the calculation operation.

In some embodiments, the surface is a bottom surface of a substrate underneath the multilayer stack. In these embodiments, the calculation operation (operation 114) may involve a forward calculation (such as that described further below with reference to FIG. 5) in which the given additional surface is on top of the other surface. Alternatively, the surface may be a top surface of the multilayer stack. In these embodiments, the calculation operation (operation 114) may involve an inverse film-fabrication calculation (such as that described further below with reference to FIG. 6) in which the given additional surface is underneath the other surface.

Additionally, prior to calculating the second surface profile (operation 114), the computer system may optionally receive an optical characteristic of the multilayer stack (operation 112), and the calculation operation (operation 114) may be based on the received optical characteristic. Note that the optical characteristic may include information corresponding to a complex index of refraction of the multilayer stack at one wavelength. In some embodiments, the calculation operation (operation 114) is based on: the complex indices of refraction of materials in the multilayer stack proximate to at least the one wavelength; physical properties of materials in the multilayer stack; and/or deposition rates of one or more layers in the multilayer stack. Moreover, the calculation operation (operation 114) may involve simulating deposition of one or more layers in the multilayer stack.

Furthermore, the surface profile may include a shape that, at a given location on the surface, is associated with more than one value of a vertical displacement (which is described further below with reference to FIG. 3). Additionally, the surface profile may include a surface roughness.

In some embodiments, after repeating the calculation operation (operation 114), the computer system optionally determines an acceptance condition of the multilayer stack (operation 118) based on one or more of the surface profiles in the determined set of surface profiles. For example, the computer system may determine whether a photo-mask that includes the calculated set of surface profiles in the multilayer stack can accurately print a target pattern on a wafer or a semiconductor die during a photolithographic process. In particular, the optical characteristic of the multilayer stack may be used to estimate an aerial image and/or a resist pattern on the wafer. In an exemplary embodiment, deviations less than 10% in a critical dimension in an estimated resist pattern on the wafer relative to the critical dimension of a target pattern (such as a layer in a circuit design) are acceptable.

After determining the acceptance condition (operation 118), the computer system may optionally provide a remedial action (operation 120) based on the determined acceptance condition. For example, the computer system may provide instructions or suggestions as to how to repair or rework the photo-mask that includes the calculated set of surface profiles in the multilayer stack (and, more generally, a remedial action that can be performed on the photo-mask). In particular, the remedial action may include modification to the mask pattern of the photo-mask, which may involve a subtractive process (such as etching) and/or an additive process (such as depositing another layer or an additional material on the photo-mask). In an exemplary embodiment, the mask pattern may be modified or another may be added so that the deviations in the critical dimension of the estimated resist pattern are less than 10% relative to the critical dimension of the target pattern.

Note that, at least during the calculation operation (operation 114), a given surface profile may be represented using a level-set function. Moreover, the multilayer stack may be associated with a lithographic process. For example, the multilayer stack may be associated with an extreme ultraviolet photo-mask.

In some embodiments of method 100 there are additional or fewer operations, the order of the operations is changed, and two or more operations are combined into a single operation.

In an exemplary embodiment, method 100 is used to determine the speed of a moving front during film growth in the normal direction to the film. The speed of the moving front is a function of: the shape of front, its normal direction, the deposition speed, and additional fabrication parameters. The growth rate in method 100 may be modeled empirically. Once the growth rate is specified, and an initial shape is given, the future shape can be obtained by solving the generalized Eikonal equation. This may be achieved using a level-set function in which the zero-contour is the moving front.

Figure 2:
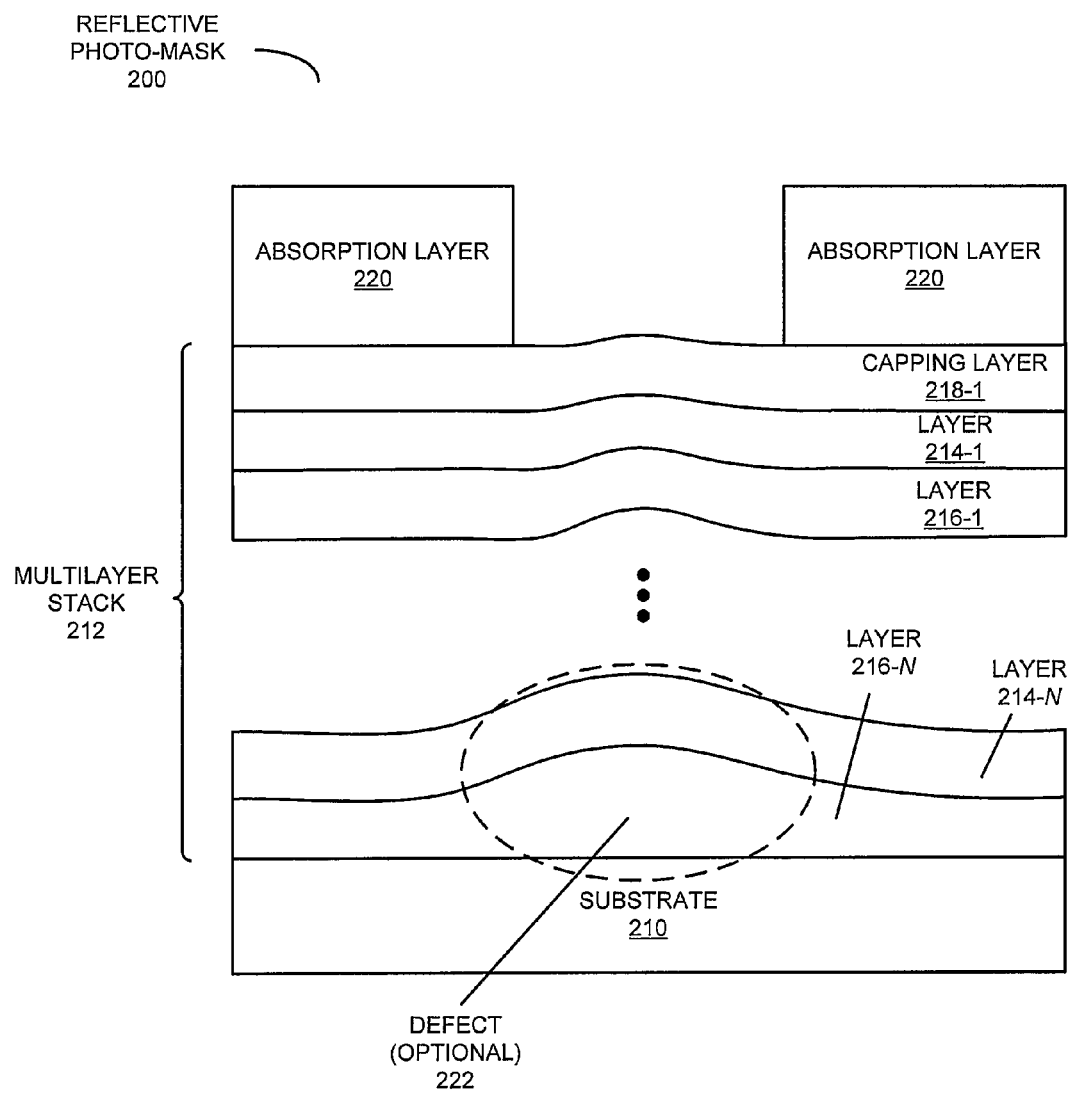
FIG. 2 is a drawing illustrating a side view of a multilayer stack in a reflective photo-mask accordance with an embodiment of the present invention.

While method 100 can be applied to a wide variety of materials, fabrication processes, and devices that include multiple layers (such as optical gratings, optical filters, etc.), in the discussion that follows a reflective photo-mask that includes a multilayer stack is used as an illustrative example. FIG. 2 presents a drawing illustrating a side view of a multilayer stack 212 in a reflective photo-mask 200. In particular, multilayer stack 212 may be deposited on a substrate 210 (such as silicon or quartz). Note that multilayer stack 212 includes alternating layers 214 and 216. For example, these layers may, respectively, include silicon and molybdenum, and may, respectively, have thicknesses of 4 nm and 2 nm. In some embodiments, there are 40 instances of alternating layers 214 and 216 (or 80 layers in total). In this example, the number of alternating layers 214 and 216, and their nominal (target) thicknesses, may specify the geometry of multilayer stack 212.

Furthermore, a capping layer 218 (such as ruthenium) may be deposited onto multilayer stack 212. Additionally, an absorption layer 220 (such as tantalum nitride) may be deposited on top of capping layer 218, and this absorption layer 220 may be patterned (for example, using electron-beam lithography) to define the two-dimensional mask pattern.

Multilayer stack 212 may include an optional defect 222, such as one associated with a fabrication process. For example, the reflective photo-mask may be fabricated using a sputtering process, and a buried defect, such as a 'bump' or a change in vertical position, may occur between substrate 210 and multilayer stack 212 and/or between layers in multilayer stack 212. In some embodiments, optional defect 222 has a height of 15 nm, which results in a 1.5 nm vertical deviation or displacement at a surface of multilayer stack 212. In other embodiments, optional defect 222 has a height between 2-5 nm and a width of 50 nm.

Note that the impact of optional defect 222 can be studied in a variety of ways. In the present discussion, a surface profile, such as that of layer 216-N or 218 or, may be used to determine the surface profiles of layers 214, 216 and/or 218. These determined surface profiles may be used to determine an acceptance condition of reflective photo-mask 200 and/or to guide repair or rework, such as changes to the mask pattern in absorption layer 220 or adding another material to the surface of reflective photo-mask 200 to compensate or correct for optional defect 222. Alternatively, in some embodiments reflective photo-mask 200 does not include optional defect 222. Instead, the impact of the roughness of layer 216-N or 218 may be used to determine the surface profiles of layers 214, 216 and/or 218. Once again, these determined surface profiles may be used to determine an acceptance condition of reflective photo-mask 200 and/or to guide repair or rework.

In particular, once the set of surface profiles has been determined, the aerial image of reflective photo-mask 200 at an image plane in a photo-lithographic system can be computed. Alternatively or additionally, an estimated photo-resist pattern on a semiconductor die at the image plane can be computed to determine if defect 222 and/or the set of surface profiles result in a 'printable' defect. In this way, it can be determined if reflective photo-mask 200 is compatible with or can be used safely with a particular mask pattern in a photolithographic process, e.g., reflective photo-mask 200 results in acceptable aerial images and/or estimated photo-resist patterns. Thus, method 100 (FIG. 1) may be used to qualify reflective photo-mask 200. Note that the conditions associated with the photolithographic process may include: immersion optics, a source pattern (for example, an annular, quadrupole, disk illumination with a sigma of 0.75, and/or a pixilated source pattern), a numerical aperture of 0.32 or 0.67, a wavelength of 13.5 nm, etc.

In an exemplary embodiment, the calculation technique described above is used to solve a 3-dimensional (3D) reaction diffusion equation, which may be expressed as a generalized Eikonal equation. In these embodiments, the received surface profile (operation 110) may constitute a boundary condition in the calculation.

In some embodiments, the generalized Eikonal equation includes a form of a Hamilton-Jacobi equation, such as:

$$|grad(T)| \cdot r = F\left(\frac{\nabla T}{|\nabla T|}, x, y, n, k, \phi\right),$$

where grad( ) is a vector gradient operator, T is a function corresponding to a given surface in multilayer stack 212, r is a vector development rate, and F is a function of: a normal to the given surface $$\frac{\nabla T}{|\nabla T|},$$

position (x, y), the complex index of refraction (n, k) at a wavelength and, optionally, a source-shadowing parameter ϕ. Note that r may be determined from a Mack model, a notch model, a lumped-parameter model, an enhanced-Mack model, and/or an enhanced-notch model. Furthermore, T may include a level-set function. For example, T may include a grayscale or a bitmap representation of the given surface. Such a representation may allow the surface profiles in multilayer stack 212 to be multivalued, which may allow surface profiles to be determined if the initial surface profile includes a shape (such as a top hat) that is not single-valued.

Figure 3:
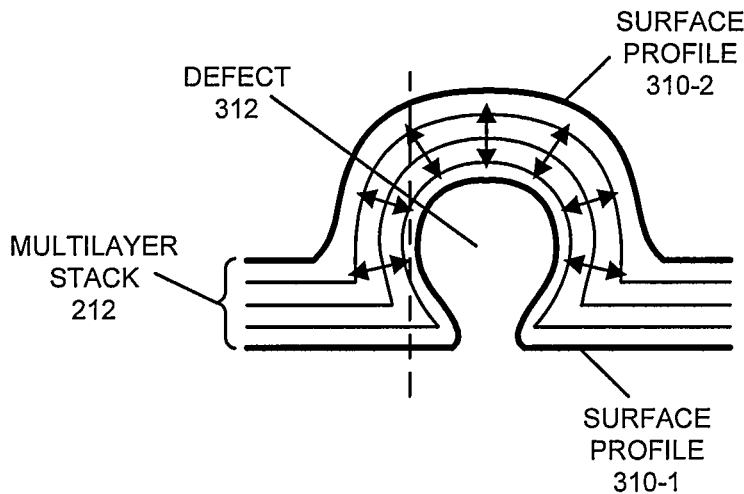
FIG. 3 is a drawing illustrating a side view of film growth in accordance with an embodiment of the present invention.

This is illustrated in FIG. 3, which presents a drawing showing a side view of film growth during the calculation technique. In this example, the film growth along normal directions (represented by the arrows in FIG. 3) to either of surface profiles 310 in multi-layer stack 212 can be determined by solving the generalized Eikonal equation for a specific deposition process, including: a deposition rate (such as 0.01-200 nm/s), a deposition material and an environment. As illustrated by the dashed line in FIG. 3, note that defect 312 may result in layers in multi-layer stack 212 that are multivalued. Such multivalued functions can be represented using level sets. Note that surface profile 310-1 may be represented by $T_0$ equal to zero, and surface profile 310-2 may be represented by $T_t$ equal to zero. In this case, the generalized Eikonal equation may be expressed as $$T_t + |grad(T)| \cdot r = 0.$$

In an exemplary embodiment, the calculation technique is used to model film growth in a multilayer stack in a reflective photo-mask at a speed (i.e., the vector development rate) that the curvilinear multilayer moves normal to the growth front. This speed may be dependent on the film material properties, as well as the deposition, contraction, etching and spin parameters. In addition, the speed may be process dependent. For example, the deposition rate for the molybdenum layers may be 0.07 nm/s and the deposition rate for the silicon layers may be 0.011 nm/s. Moreover, the growth speed can be determined from the incremental growth of a film along the growth direction z, which is given by $$\delta\Lambda_C \cdot \left(1 - \frac{1}{\hat{n} \cdot \hat{z}}\right) = \delta\Lambda_C \cdot \left(1 - \sqrt{1 + (\nabla h_{i-1})^2}\right),$$

where $\delta\Lambda_C$ is the film contraction after deposition (such as 0.8 nm) and ∇h is the gradient of a surface. Note that the optical properties at a wavelength of 13.5 nm may be: n equal to 0.999 and k equal to 0.00182 for a 4.17 nm thick silicon layer; n equal to 0.0.024 and k equal to 0.00644 for a 2.78 nm thick molybdenum layer; and n equal to 0.886 and k equal to 0.0171 for a 2.5 nm thick ruthenium capping layer.

Once the multilayer growth speed is determined or specified, an embodiment of the generalized Eikonal equation, such as $$|grad(T(x,y,z))| \cdot r(x,y,z) = 1,$$

can be solved to find the multilayer profile. Note that the generalized Eikonal equation is a first-order partial differential equation that can be solved with a numerical technique for a Hamilton-Jacobi type of hyperbolic equations, such as a fast-sweeping technique with finite-difference spatial discretization (such as essentially non-oscillatory spatial discretization or weighted essentially non-oscillatory spatial discretization).

Figure 4:
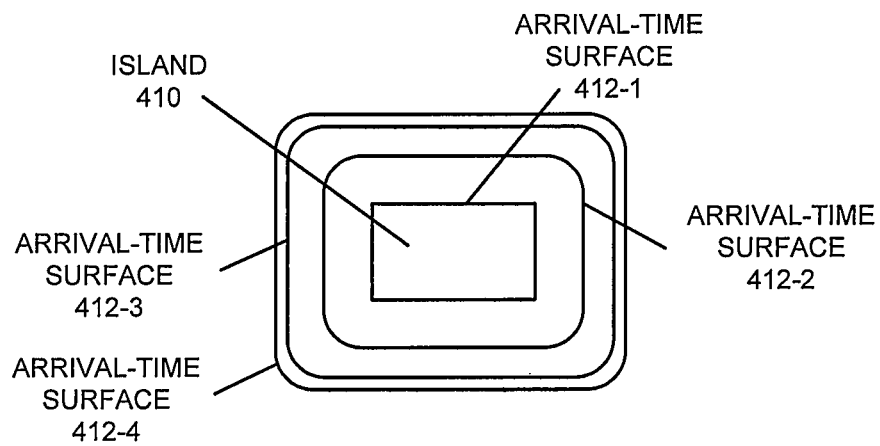
FIG. 4 is a drawing illustrating a top view of film growth in accordance with an embodiment of the present invention.

While FIG. 3 illustrates growth of continuous films or layers, in other embodiments the film growth (at least initially) in a given layer nucleates around islands that eventually merge together to form a continuous film. This is shown in FIG. 4, which presents a drawing illustrating a top view of film growth during the calculation technique. In particular, the boundaries of the film near an island 410 during film growth are defined by arrival-times surfaces 412, which (as described below) may be determined by solving the generalized Eikonal equation.

Referring back to FIG. 2, in an exemplary embodiment the generalized Eikonal equation in a given layer in multilayer stack 212 is solved using a fast-sweeping calculation. In this calculation, arrival times of a wavefront at a first layer in multilayer stack 212 may be determined using the generalized Eikonal equation (which may include the deposition rate of the first layer). For example, the first layer may be divided into cells and the arrival times in each cell may be determined by sweeping over a set of values, such as low-to-high values and/or from high-to-low values. Note that in some embodiments the arrival times may be determined based on an initial condition on an outer surface of multilayer stack 212 (i.e., the received surface profile). After a given time interval (such as the deposition time of the first layer), the surface profile on an opposite side of the first layer from the received surface profile may be determined based on the set of calculated arrival times and the given time interval since the start of the fabrication process. Thus, 2D or 3D surface of constant arrival time may be used to determine the surface profile of the opposite side of the first layer.

Next, arrival times at one or more additional layers in multilayer stack 212 further away from the outer surface may be sequentially determined by repeating these operations using the generalized Eikonal equation. Furthermore, the arrival times in a given layer in the one or more additional layers may also be determined using the calculated arrival times for an immediately adjacent layer in multilayer stack 212. In this way, the set of surface profiles may be determined without performing an iterative calculation, thereby improving the overall calculation efficiency. Note that, in some embodiments, the set of surface profiles is determined by interpolating between the calculated arrival times at the different layers in multilayer stack 212.

In this discussion, fast sweeping should be understood to include a direct solving numerical technique for determining steady-state solutions to equations, such as the generalized Eikonal equation. In particular, rather than determining a 3D solution (such as that associated with a wavefront), arrival time solutions on a sequence of 2-dimensional (2D) surfaces may be determined by sweeping from low values to high values and back along orthogonal directions in a plane of the given layer in each of the 2D surfaces. In some embodiments, the sweeping (i.e., systematically and sequentially varying) over a given set of values may include sweeping from low-to-high values (such as from −10 to +10) and then sweeping from high-to-low values (or vice versa) in a given direction in the given layer. For a given surface, the set of values in each direction may correspond to a full set of values in the 2D surface. Thus, the fast sweeping technique may be non-evolutionary or non-iterative. Note that this technique may reduce or eliminate memory constraints, such as those associated with DRAM memory, when solving equations.

However, in some embodiments a fast marching technique may be used. In these embodiments, fast marching should be understood to include an iterative numerical technique in which a narrower set of values are used. Thus, the time evolution of a wavefront may be determined. Note that this technique may be appropriate if a wavefront does not propagate over a wide area. Furthermore, fast marching may allow solutions to be quickly determined.

In some embodiments, the Eikonal equation may be solved in a given layer (i.e., the arrival times in cells in the layer may be determined) using a Green's function, a difference equation, and/or other techniques as known in the art.

By determining the set of surface profiles in a sequential fashion it may be possible to avoid an iterative solution to the generalized Eikonal equation. As a consequence, such a film-fabrication model may be used in other iterative calculations, such as inverse-optical calculations of the performance of reflective photo-mask 200. This may allow faster computations of mask-patterns. In addition, multiple simulations may be performed in order to determine a process window for the photo-lithographic process and/or the fabrication process.

Figure 5:
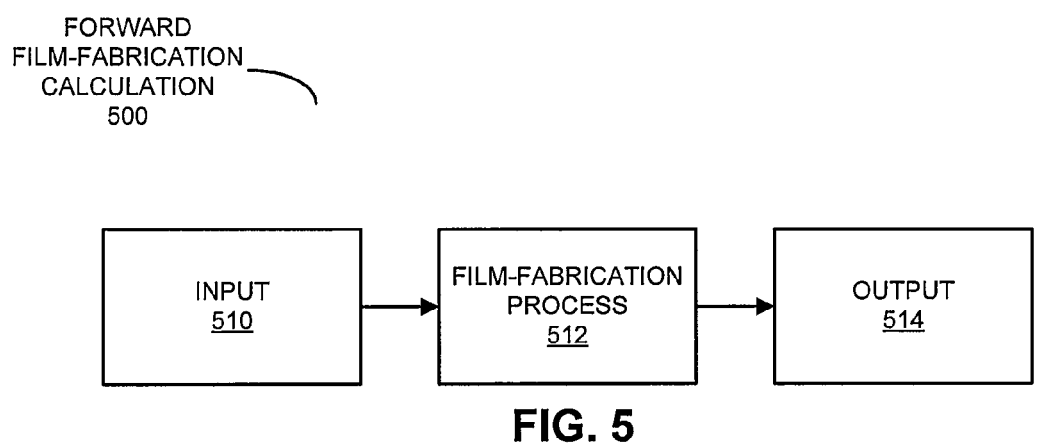
FIG. 5 is a block diagram illustrating a forward film-fabrication calculation in accordance with an embodiment of the present invention.

We now describe forward and inverse film-fabrication calculations. FIG. 5 presents a block diagram illustrating a forward film-fabrication calculation 500. In this calculation, a surface profile is used as an input 510 to film-fabrication process 512 to determine a predicted output 514 (such as another surface profile on an opposite side of a given layer). For example, input 510 may be on a bottom side of the given layer and output 514 may be a top side of the given layer. Note that film-fabrication process 512 may represent solutions to the generalized Eikonal equation.

Figure 6:
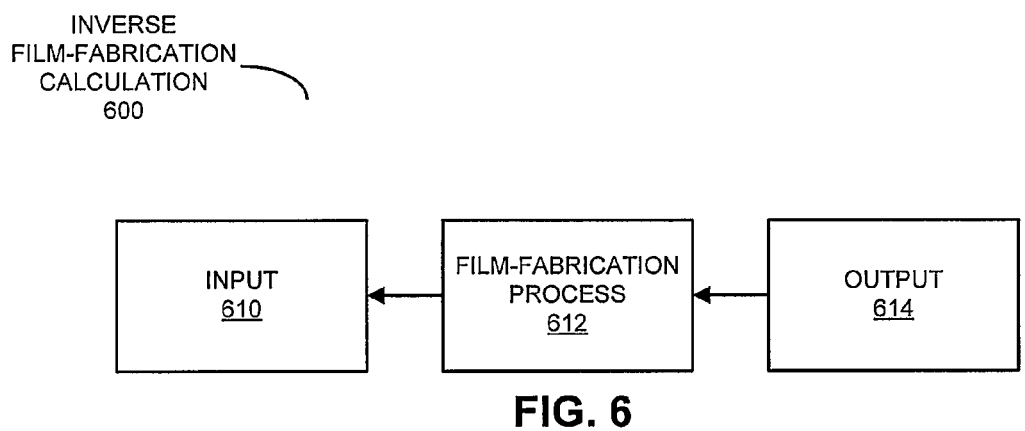
FIG. 6 is a block diagram illustrating an inverse film-fabrication calculation in accordance with an embodiment of the present invention.

FIG. 6 presents a block diagram illustrating an inverse film-fabrication calculation 600. In this calculation, a predicted input 610 (such as a predicted surface profile) to a film-fabrication process 612 is determined based on an output 614 (such as another surface profile on an opposite side of a given layer). For example, input 610 may be on a bottom side of the given layer and output 614 may be a top side of the given layer, i.e., the fabrication of the given layer may be reversed to determine the surface profile of the bottom side before the given layer was fabricated. Note that film-fabrication process 612 may represent inverse solutions to the generalized Eikonal equation.

While the preceding discussion illustrates the inverse film-fabrication calculation using a single output 614, in other embodiments multiple surface profiles of film-fabrication process 612 may be used. For example, instead of the initial surface profile, there may be an initial set of surface profiles that are each for different layers in multilayer stack 212 (FIG. 2). Furthermore, in some embodiments each of the surface profiles used in the inverse film-fabrication calculation 600 or one or more term(s) including some combination of the surface profiles may be multiplied by a corresponding weight. In this way, inverse film-fabrication calculation 600 may emphasize one or more of the surface profiles relative to other surface profiles (for the same or other layers) used in inverse film-fabrication calculation 600.

In some embodiments, inverse film-fabrication calculation 600 is based on iterative minimization of a cost function (H), which is also sometimes referred to as an 'error function' or a 'Hamiltonian function.' In particular, during each iteration of inverse film-fabrication calculation 600 the cost function may be a function of the difference between output 614 and a surface profile that results when input 610 is projected through film-fabrication process 612. In some embodiments, input 610 initially corresponds to the target surface profile, and as the calculation progresses this pattern is allowed to evolve while output 614 is held constant (subject to the constraints that there are a finite number of discrete steps sizes or pixel sizes).

In embodiments with multiple surface profiles at output 614 or input 610, the cost function (H) equals $$\sum_{j=1}^{N} w_j |I_j - I_{oj}|^n,$$

where $I_j$ is the forward projection of the jth modified surface profile at input 610 (out of N surface profiles in this example) through film-fabrication process 612, $w_j$ is a corresponding weight, $I_{oj}$ is the jth surface profile at output 614, and n is a power. (Alternatively, initially in inverse film-fabrication calculation 600, $I_{oj}$ is the forward projection of the jth target surface profile at input 610.) Note that the cost function (H) approaches zero as $I_j$ approaches $I_{oj}$.

In an exemplary embodiment, N is 3 and n is 2. Three initial surface profiles at output 614 may be determined at three different layers. Alternatively or additionally, the three surface profiles at output 614 may be determined using different metrology techniques. Furthermore, a corresponding set of weights $\{w_j\}$ may be 1, 0.5, and 0.1 for layers progressively further away from the given layer.

In other embodiments, the weights are varied as inverse film-fabrication calculation 600 progresses and/or different weights are used for specific parts (or even pixels) of a surface profile. For example, the weights may be determined based on the difference between $I_j$ and $I_{oj}$ at a given step or iteration in inverse film-fabrication calculation 600. This approach may exaggerate the features or defects, especially when inverse film-fabrication calculation 600 is close to a local or global minimum and the cost function (H) corresponds to small differences. Thus, in general the cost function (H) may be expressed as a double integral over the surface areas of the layers and there may be separate time-dependent weights for $I_j$ and $I_{oj}$. Furthermore, in some embodiments the cost function (H) is expressed as a relative difference between $I_j$ and $I_{oj}$ for at least a portion of inverse film-fabrication calculation 600 as it progresses.

It will be recognized by one of ordinary skill in the art that inverse film-fabrication calculation 600 described above is poorly defined. In particular, numerous possible surface profiles at input 610 may result from the same observed output 614. Therefore, input 610 may be selected such that it is 'most likely' to represent the 'deconvolved' or deconstructed surface profile. A variety of constraints and additional criteria may be imposed when determining the solution(s) to this problem in order to find a unique answer(s). For example, input 610 may be that which has the smallest value of the cost function (H).

Note that film-fabrication process 612 may be different than film-fabrication process 512 (FIG. 5). In general, information about film-fabrication processes 512 (FIG. 5) and/or 612 may include some or all of the aspects of the fabrication system, such as: the material, the deposition rate, source shadowing, vacuum level, etc.

The calculations corresponding to one or more film-fabrication processes in forward film-fabrication calculation 500 (FIG. 5) and/or inverse film-fabrication calculation 600 may be implemented using Fourier techniques. Furthermore, film-fabrication processes in forward film-fabrication calculation 500 (FIG. 5) and/or inverse film-fabrication calculation 600 may include multiple models of film-fabrication processes. Also note that while film-fabrication processes 512 (FIG. 5) and 612 have, respectively, been traversed in a particular direction, these film-fabrication processes may be traversed in either direction.

In some embodiments, aspects of forward film-fabrication calculation 500 in FIG. 5 (such as the surface profiles) and/or inverse film-fabrication calculation 600 are represented using one or more level-set functions. Furthermore, in some embodiments, forward film-fabrication calculation 500 (FIG. 5) and/or inverse film-fabrication calculation 600 are divided into a series of overlapping sub-problems (also referred to as 'work units'), at least some of which are processed independently and/or concurrently. These work units may be based on elements or structures (for example, repetitive structures) in multilayer stack 212 (FIG. 2).

In some embodiments, during each iteration of inverse film-fabrication calculation 600 the level-set function corresponding to input 610 being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the cost function. In an exemplary embodiment, $\nabla(H)$ is $$\left.\frac{\delta H}{\delta \phi}\right|_{\varphi_i},$$

i.e., it is the Frechet derivative of the cost function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse film-fabrication calculation 600. In particular, the cost function H may be allowed to increase during some steps as the calculation evolves. In this way, the global minimum in the multi-dimensional space may be determined. Note that the size of this multi-dimensional space may be a number of quantization levels to the power of the number of pixels in the surface profile.

In one embodiment, in any iteration of inverse film-fabrication calculation 600, changes in $\phi$ that decrease or increase the cost function (H) up to 0.5% are performed. If a larger change will result (e.g., $\Delta H > 0.5\%$), the step size $\Delta t$ may be decreased by a factor that is at least greater than 1 and the change in $\phi$ is implemented (or not) based on a probability and a value P given by $$e^{\frac{-kH_{i+1}}{H_i}},$$

where $H_{i+1}$ is the cost function in the $i+1^{th}$ iteration (if the change in $\phi$ is implemented) and $H_i$ is the cost function in $i^{th}$ iteration (note that the ratio of $H_{i+1}/H_i$ equals $1+\Delta H$). In some embodiments k is 0.155. For example, if the value P is 0.3 and the probability is a random (or pseudorandom) number between 0 and 1 that is less than P, the cost function may be increased before proceeding. In this way, inverse film-fabrication calculation 600 initially takes large steps and thereby explores the solution space.

In some embodiments, inverse film-fabrication calculation 600 is run for 100, 1000 or 10,000 iterations at which point the optimal solution has been determined. In other embodiments, the calculation is stopped based on convergence criteria, such as oscillatory behavior, a relative and/or absolute difference between the forward projection of the surface profile and the initial surface profile, the latest change to the cost function H, and/or the history of changes to the cost function H. For example, the relative difference may be less than 1% and/or the absolute difference may be 10 nm for a given layer thickness of 100 nm.

We now describe embodiments of computer systems that may implement the embodiments described previously. FIG.

7 presents a block diagram illustrating a computer system 700 in accordance with an embodiment of the present invention. The computer system 700 includes one or more processors 710, a communication interface 712, a user interface 714, and one or more signal lines 722 coupling these components together. Note that the one or more processing units 710 may support parallel processing and/or multi-threaded operation, the communication interface 712 may have a persistent communication connection, and the one or more signal lines 722 may constitute a communication bus. Moreover, the user interface 714 may include a display 716, a keyboard 718, and/or a pointer 720, such as a mouse.

Memory 724 in the computer system 700 may include volatile memory and/or non-volatile memory. More specifically, memory 724 may include ROM, RAM, EPROM, EEPROM, FLASH, one or more smart cards, one or more magnetic disc storage devices, and/or one or more optical storage devices. Memory 724 may store an operating system 726 that includes procedures (or a set of instructions) for handling various basic system services for performing hardware dependent tasks. The memory 724 may also store communications procedures (or a set of instructions) in a communication module 728. The communication procedures may be used for communicating with one or more computers, devices and/or servers, including computers, devices and/or servers that are remotely located with respect to the computer system 700.

Memory 724 may also include one or more program modules (or a set of instructions), including a modeling module 730 (or a set of instructions) for modeling a fabrication process, a fast-sweeping module 732 (or a set of instructions) and an acceptance module 746 (or a set of instructions) for determining the set of surface profiles (such as roughness of layers) in the multilayer stack during the fabrication process. In addition, memory 724 may include initial conditions 734 (such as the surface profile of a top or a bottom layer in the multilayer stack) and/or material properties 736 for use by the modeling module 730 and/or the fast-sweeping module 732. Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software and/or software in a photo-mask repair system.

In some embodiments, the memory 724 includes an optional data structure 738. This data structure may store arrival times 740 for some or all of the layers in the multilayer stack. Furthermore, in some embodiments the memory 724 includes determined surface profiles 742 and/or calculated process windows 744 for a photolithographic process. This information may be used by acceptance module 746 to determine one or more acceptance criteria 748 of the reflective photo-mask and/or one or more remedial actions 750 for the reflective photo-mask.

Instructions in the various modules in the memory 724 may be implemented in a high-level procedural language, an object-oriented programming language, and/or in an assembly or machine language. The programming language may be compiled or interpreted, i.e., configurable or configured (which are used interchangeably in the present discussion) to be executed by the one or more processing units 710.

In some embodiments, at least some of the information in memory 724 is encrypted. Furthermore, information 'stored' in memory 724 in FIG. 7 may be stored locally and/or at remote locations.

Figure 7:
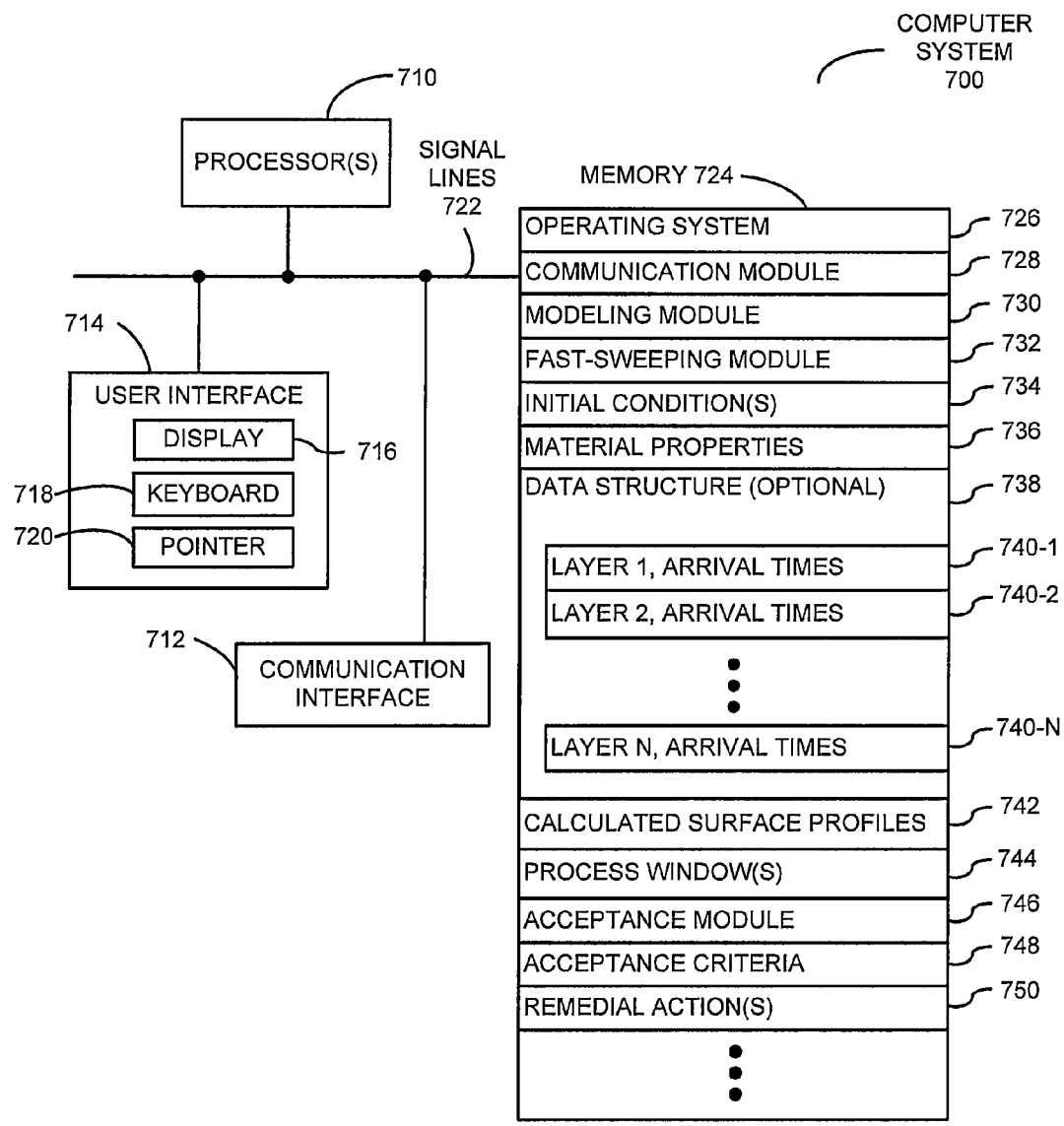
FIG. 7 is a block diagram illustrating a computer system in accordance with an embodiment of the present invention.

Although the computer system 700 is illustrated as having a number of discrete components, FIG. 7 is intended to be a functional description of the various features that may be present in the computer system 700 rather than as a structural schematic of the embodiments described herein. In practice, and as recognized by those of ordinary skill in the art, the functions of the computer system 700 may be distributed over a large number of servers or computers, with various groups of the servers or computers performing particular subsets of the functions. In some embodiments, some or all of the functionality of the computer system 700 may be implemented in one or more ASICs and/or one or more digital signal processors DSPs.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

Computer system 700 may include fewer components or additional components, two or more components may be combined into a single component, and/or a position of one or more components may be changed. In some embodiments the functionality of computer system 700 may be implemented more in hardware and less in software, or less in hardware and more in software, as is known in the art.

Figure 8:
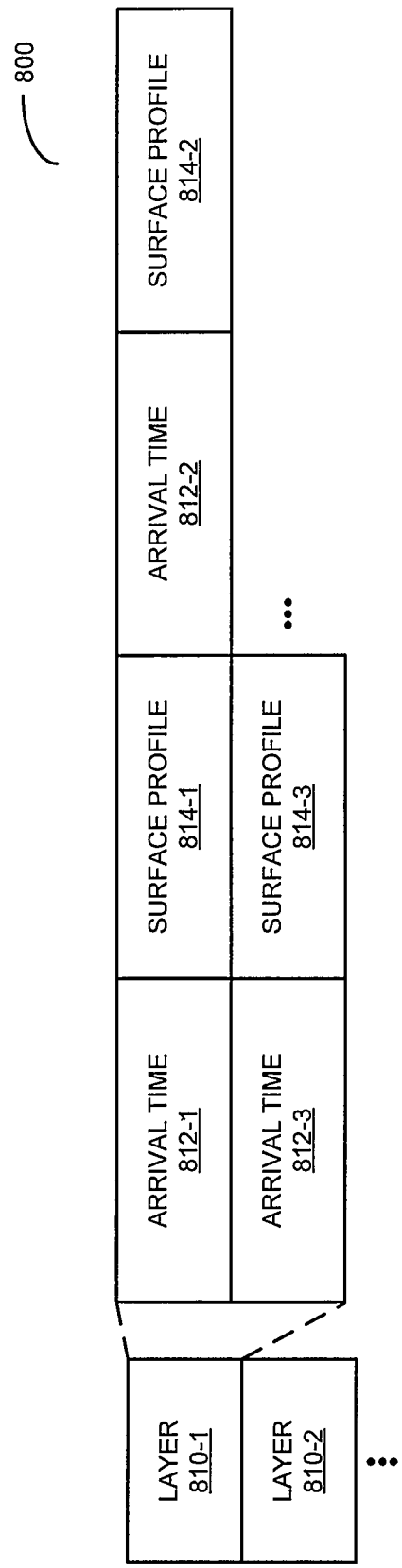
FIG. 8 is a block diagram illustrating a data structure in accordance with an embodiment of the present invention.

We now discuss data structures that may be used in the computer system 700 (FIG. 7). FIG. 8 presents a block diagram illustrating a data structure 800 in accordance with an embodiment of the present invention. This data structure may include surface-profile results for layers 810. The results for each of the layers 810, such as layer 810-1, may include arrival times 812 and corresponding surface profiles 814 (such as a set of cells in the layer 810-1 that each have a common arrival time). Note that that in some embodiments of the data structure 800 there may be fewer or additional components, two or more components may be combined into a single component, and/or a position of one or more components may be changed.

While the preceding discussion has focused on solutions to a film-fabrication process, such as that described by a generalized Eikonal equation, in other embodiments the method and/or apparatus may be used to solve other differential equations in applied mathematical problems.

In the preceding description, we refer to 'some embodiments.' Note that 'some embodiments' describes a subset of all of the possible embodiments, but does not always specify the same subset of embodiments.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a set of surface profiles, comprising:

receiving a surface profile of a surface in a multilayer stack of a reflective photomask, wherein such surface profile was obtained by measuring a top surface of the multilayer stack or a top surface of a substrate underneath such multilayer stack using a microscopy tool to obtain a multi-value grayscale or bitmap representation of such surface;

calculating a second surface profile of a second surface in the multilayer stack based on a generalized Eikonal equation, a geometry of the multilayer stack and the surface profile, wherein the second surface is associated with a different layer in the multilayer stack than the surface, and wherein the second surface is adjacent to the surface in the multilayer stack;

repeating, one or more times, the calculation operation for additional surfaces in the multilayer stack based on a generalized Eikonal equation, a geometry of the multilayer stack, the surface profile, and surface profiles determined in preceding instances of the calculation operation, thereby determining the set of surface profiles, wherein a given additional surface is associated with a different layer in the multilayer stack than the surface profile and the surface profiles determined in preceding instances of the calculation operation, and wherein the given additional surface is adjacent to another surface in the multilayer stack that is associated with another layer in an immediately preceding instance of the calculation operation, and wherein the surface profile is used as a boundary condition in calculating the set of surface profiles;

based on the set of surface profiles, indicating whether the multilayer stack of the photomask will result in a printable defect on a semiconductor wafer during a photolithography process and such photomask requires a remedial action to repair the photomask; and performing the remedial action to repair the photomask if it is indicated that the multilayer stack will result in a printable defect.

2. The method of claim 1, wherein the surface is a top surface of the multilayer stack.

3. The method of claim 1, wherein the calculation operation involves an inverse calculation in which the given additional surface is underneath the other surface.

4. The method of claim 1, wherein the surface is a top surface of a substrate underneath the multilayer stack.

5. The method of claim 1, wherein the calculation operation involves a forward calculation in which the given additional surface is on top of the other surface.

6. The method of claim 1, wherein, prior to calculating the second surface profile, the method further comprises receiving an optical characteristic of the multilayer stack; and
wherein the calculation operation is further based on the received optical characteristic.

7. The method of claim 1, wherein the optical characteristic includes information corresponding to a complex index of refraction of the multilayer stack at one wavelength.

8. The method of claim 1, wherein the calculation operation is further based on the complex indices of refraction of materials in the multilayer stack proximate to at least one wavelength.

9. The method of claim 1, wherein the calculation operation is further based on physical properties of materials in the multilayer stack.

10. The method of claim 1, wherein the calculation operation is further based on deposition rates of one or more layers in the multilayer stack.

11. The method of claim 1, wherein the calculation operation involves simulating deposition of one or more layers in the multilayer stack.

12. The method of claim 1, wherein the surface profile includes a shape that, at a given location on the surface, is associated with more than one value of a vertical displacement.

13. The method of claim 1, wherein the surface profile includes a surface roughness.

14. The method of claim 1, wherein, after repeating the calculation operation, the method further involves determining an acceptance condition of the multilayer stack based on one or more of the surface profiles in the determined set of surface profiles.

15. The method of claim 1, wherein, after determining the acceptance condition, the method further involves providing a remedial action based on the determined acceptance condition.

16. The method of claim 1, wherein, at least during the calculation operation, a given surface profile is represented using a level-set function.

17. The method of claim 1, wherein the photomask is an extreme ultra-violet photo-mask.

18. The method of claim 1, wherein the multilayer stack is associated with a lithographic process.

19. A non-transitory computer-program product for use in conjunction with a computer system, the computer-program product comprising a computer-readable storage medium and a computer-program mechanism embedded therein to determine a set of surface profiles, the computer-program mechanism including:

instructions for receiving a surface profile of a surface in a multilayer stack of a reflective photomask, wherein such surface profile was obtained by measuring a top surface of the multilayer stack or a top surface of a substrate underneath such multilayer stack using a microscopy tool to obtain a multi-value grayscale or bitmap representation of such surface;

instructions for calculating a second surface profile of a second surface in the multilayer stack based on a generalized Eikonal equation, a geometry of the multilayer stack and the surface profile, wherein the second surface is associated with a different layer in the multilayer stack than the surface, and wherein the second surface is adjacent to the surface in the multilayer stack; and instructions for repeating, one or more times, the calculation operation for additional surfaces in the multilayer stack based on a generalized Eikonal equation, a geometry of the multilayer stack, the surface profile, and surface profiles determined in preceding instances of the calculation operation, thereby determining the set of surface profiles, wherein a given additional surface is associated with a different layer in the multilayer stack than the surface profile and the surface profiles determined in preceding instances of the calculation operation, and wherein the given additional surface is adjacent to another surface in the multilayer stack that is associated with another layer in an immediately preceding instance of the calculation operation, and wherein the surface profile is used as a boundary condition in calculating the set of surface profiles; and instructions for, based on the set of surface profiles, indicating whether the multilayer stack of the photomask will result in a printable defect on a semiconductor wafer during a photolithography process and such photomask requires a remedial action to repair the photomask.

20. A computer system, comprising:
at least one processor;
at least one memory; and
at least one program module, the program module stored in the memory and configured to be executed by the processor to determine a set of surface profiles, the program module including:
instructions for receiving a surface profile of a surface in a multilayer stack of a reflective photomask, wherein such surface profile was obtained by measuring a top surface of the multilayer stack or a top surface of a substrate underneath such multilayer stack using a microscopy tool to obtain a multi-value grayscale or bitmap representation of such surface;
instructions for calculating a second surface profile of a second surface in the multilayer stack based on a generalized Eikonal equation, a geometry of the multilayer stack and the surface profile, wherein the second surface is associated with a different layer in the multilayer stack than the surface, and wherein the second surface is adjacent to the surface in the multilayer stack; and
instructions for repeating, one or more times, the calculation operation for additional surfaces in the multilayer stack based on a generalized Eikonal equation, a geometry of the multilayer stack, the surface profile, and surface profiles determined in preceding instances of the calculation operation, thereby determining the set of surface profiles, wherein a given additional surface is associated with a different layer in the multilayer stack than the surface profile and the surface profiles determined in preceding instances of the calculation operation, and wherein the given additional surface is adjacent to another surface in the multilayer stack that is associated with another layer in an immediately preceding instance of the calculation operation, and wherein the surface profile is used as a boundary condition in calculating the set of surface profiles; and instructions for, based on the set of surface profiles, indicating whether the multilayer stack of the photomask will result in a printable defect on a semiconductor wafer during a photolithography process and such photomask requires a remedial action to repair the photomask.

* * * * *